United States Patent
Richardson et al.

(10) Patent No.: US 10,063,002 B2
(45) Date of Patent: Aug. 28, 2018

(54) CONFIGURABLE DEVICE CONTROL NETWORK

(71) Applicant: Deako, Inc., Mountlake Terrace, WA (US)

(72) Inventors: Derek Richardson, Mountlake Terrace, WA (US); Patrick Prendergast, Mountlake Terrace, WA (US); Cole Wilson, Mountlake Terrace, WA (US); Erik Anderson, Mountlake Terrace, WA (US); Dana Olson, Mountlake Terrace, WA (US)

(73) Assignee: DEAKO, Inc., Seattle, WA (US)

( * ) Notice: Subject to any disclaimer, the term of this patent is extended or adjusted under 35 U.S.C. 154(b) by 207 days.

(21) Appl. No.: 15/074,915

(22) Filed: Mar. 18, 2016

(65) Prior Publication Data
US 2017/0062968 A1 Mar. 2, 2017

Related U.S. Application Data

(60) Provisional application No. 62/212,388, filed on Aug. 31, 2015.

(51) Int. Cl.
*H05K 5/02* (2006.01)
*H02G 3/08* (2006.01)
(Continued)

(52) U.S. Cl.
CPC ........... *H01R 13/447* (2013.01); *G06F 3/041* (2013.01); *H02G 3/08* (2013.01); *H02G 3/12* (2013.01);
(Continued)

(58) Field of Classification Search
CPC .. H05B 37/0272; G06F 3/041; H05K 5/0221; H05K 5/0017; H05K 5/004; H02G 3/08;
(Continued)

(56) References Cited

U.S. PATENT DOCUMENTS 5,224,649 A 7/1993 Brown et al.
6,108,202 A * 8/2000 Sumida .................. H05K 7/026
361/690

(Continued)

FOREIGN PATENT DOCUMENTS

EP 1260886 A2 11/2002

OTHER PUBLICATIONS

PCT Search Report for PCT/US2016/049797 dated Nov. 17, 2016, 9 pages.

*Primary Examiner* — Dinh T Le
(74) *Attorney, Agent, or Firm* — Suiter Swantz pc llo

(57) ABSTRACT

A network includes a first device control assembly and at least one second device control assembly. The first device control assembly is electrically connected to a power distribution panel. The first device control assembly is further configured to regulate a load. The at least one second device control assembly is electrically connected to a power distribution panel. The first device control assembly is in data communication with the at least one second device control assembly. The first device control assembly regulating the load based on the data communication from the at least one second device control assembly.

46 Claims, 17 Drawing Sheets

(51) Int. Cl.
    *H01R 13/447* (2006.01)
    *H05B 37/02* (2006.01)
    *G06F 3/041* (2006.01)
    *H05K 5/00* (2006.01)
    *H05K 5/03* (2006.01)
    *H02G 3/12* (2006.01)
    *H02G 3/16* (2006.01)
    *H01R 12/72* (2011.01)
    *H01R 13/24* (2006.01)
    *H01R 13/627* (2006.01)
    *H01R 24/62* (2011.01)
    *H01R 107/00* (2006.01)

(52) U.S. Cl.
    CPC .......... *H02G 3/16* (2013.01); *H05B 37/0272* (2013.01); *H05K 5/0004* (2013.01); *H05K 5/0017* (2013.01); *H05K 5/0221* (2013.01); *H05K 5/0256* (2013.01); *H05K 5/03* (2013.01); *H01R 12/724* (2013.01); *H01R 13/2407* (2013.01); *H01R 13/6275* (2013.01); *H01R 24/62* (2013.01); *H01R 2107/00* (2013.01)

(58) Field of Classification Search
    CPC .......... H02G 3/12; H02G 3/16; H01R 12/724; H01R 13/2407; H01R 13/6273; H01R 24/62
    USPC .......................................................... 307/40
    See application file for complete search history.

(56) References Cited

U.S. PATENT DOCUMENTS

| | | | |
|---|---|---|---|
| 7,915,528 B2* | 3/2011 | Ni | H01R 13/5213 |
| | | | 174/50 |
| 8,759,674 B2* | 6/2014 | Korcz | H02G 3/14 |
| | | | 174/480 |
| 9,293,276 B2* | 3/2016 | Kawamura | H01R 33/975 |
| 2006/0065510 A1 | 3/2006 | Kiki et al. | |
| 2006/0066151 A1 | 3/2006 | Hatemata | |
| 2009/0138353 A1 | 5/2009 | Mendelson | |
| 2010/0097225 A1 | 4/2010 | Petricoin, Jr. | |
| 2013/0099009 A1 | 4/2013 | Filson et al. | |

* cited by examiner

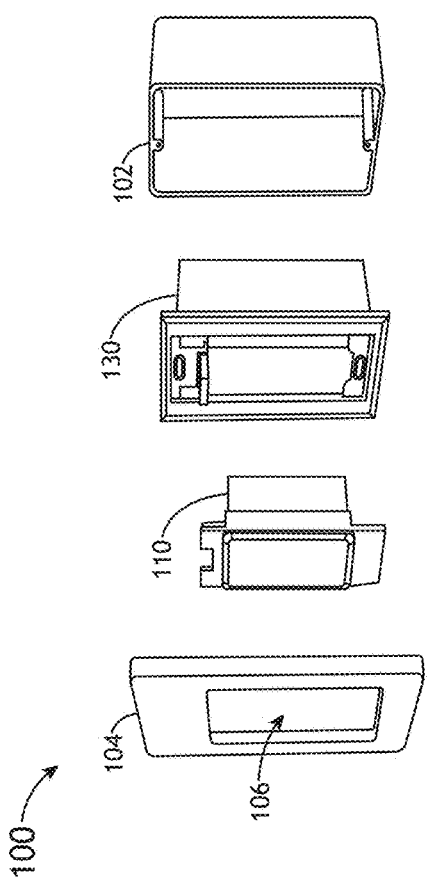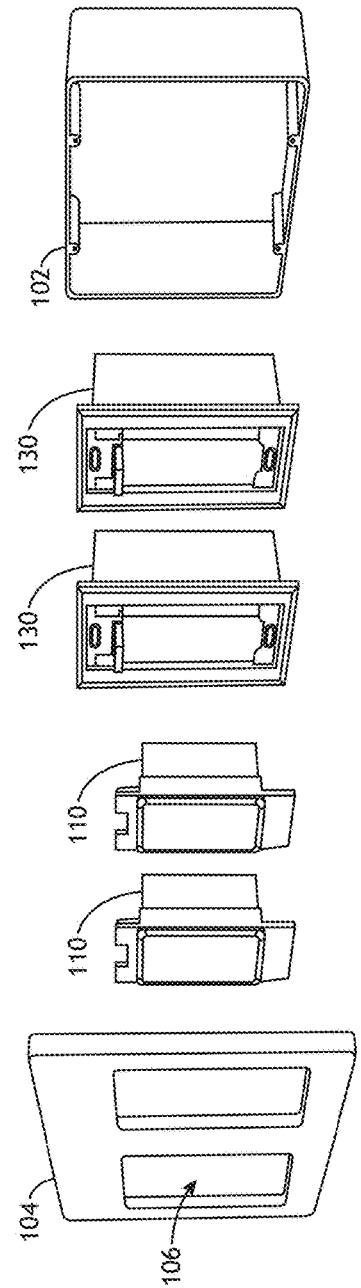

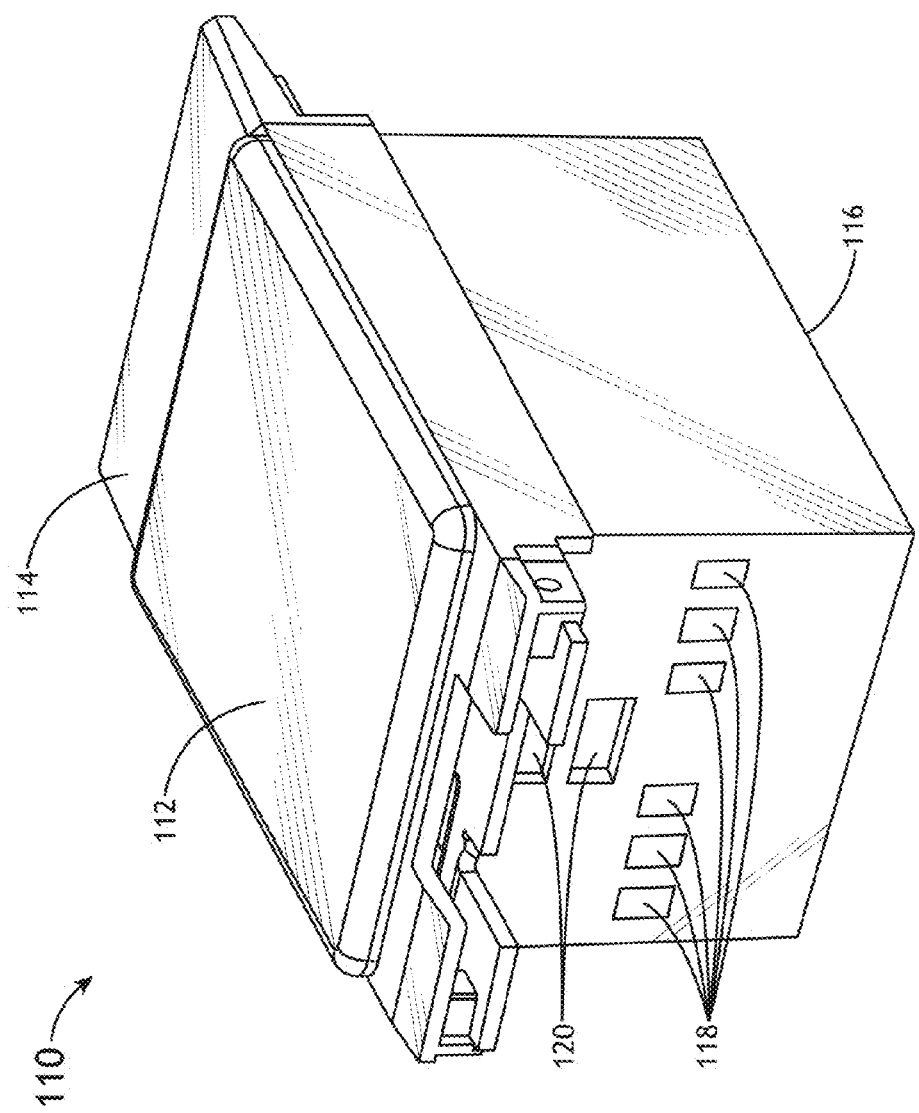

| Device Control Assembly | Location | Paired Devices |
|---|---|---|
| DC1 | Bedroom 2 | EC1 |
| DC2 | Hallway 2 | EC2, EC3 |
| DC3 | Hallway 2 | EC2, EC3 |
| DC4 | Laundry | EC9 |
| DC5 | Hallway 1 | EC5, EC6, EC12 |
| DC6 | Hallway 1 | EC5, EC6, EC12 |
| DC7 | Bedroom 1 | EC4, ML1, S1, S2, S3, S5, S6, S7, S8, S9 |
| DC8 | Kitchen | EC7, EC8, S8 |
| DC9 | Living Room | ML2, ML3, EC12, EC13, EC14, S8 |
| DC10 | Bathroom | EC10 |
| DC11 | Entry | EC11 |

FIG. 8B

| Device | Physical Pairing | Addressable Pairing |
|---|---|---|
| EC1 | DC1 | |
| EC2 | DC2 | DC3 |
| EC3 | DC3 | DC2 |
| EC4 | DC7 | |
| EC5 | DC5, DC6 | |
| EC6 | DC5, DC6 | |
| EC7 | DC8 | |
| EC8 | DC8 | |
| EC9 | DC4 | |
| EC10 | DC10 | |
| EC11 | DC11 | |
| EC12 | DC9 | DC5, DC6 |
| EC13 | DC9 | |
| EC14 | DC9 | |

FIG.8C

| Light State | | | Device Actuated | Next State | | |
|---|---|---|---|---|---|---|
| EC5 | EC6 | EC12 | | EC5 | EC6 | EC12 |
| On | On | On | DC5, DC6 | Off | Off | Off |
| On | On | On | DC9 | On | On | Off |
| On | On | Off | DC5, DC6 | Off | Off | Off |
| On | On | Off | DC9 | On | On | On |
| Off | Off | On | DC5, DC6 | On | Off | On |
| Off | Off | Off | DC9 | On | On | Off |
| Off | Off | Off | DC5, DC6 | Off | Off | On |

FIG. 8D

CONFIGURABLE DEVICE CONTROL NETWORK

CROSS-REFERENCE TO RELATED APPLICATION

The present application claims the benefit under 35 U.S.C. § 119(e) of U.S. Provisional Application Ser. No. 62/212,388 filed Aug. 31, 2015, entitled Method and apparatus for controlling lights, which is incorporated herein by reference in the entirety.

TECHNICAL FIELD

The present disclosure relates generally to device controllers and, more particularly, to a configurable network of device controllers.

BACKGROUND

The modification of an existing electrical wiring system in a commercial or residential building is often difficult and/or costly. An electrical wiring system in a commercial or residential building typically includes a multitude of electrical circuits in which electrical wires are routed between a mains power source and electrical junction boxes placed at fixed locations throughout the building. Based on known or anticipated needs, certain electrical junction boxes are wired to have direct access to electrical power (e.g. an electrical outlet), while other electrical junction boxes are wired such that access to electrical power is controlled by electrical switches (e.g. a light or a switched electrical outlet). The electrical wiring is typically installed during a construction phase of the building, secured to support structures according to electrical and building codes, and covered during a finishing phase. In this regard, a modification of the existing wiring system in response to changing needs is generally limited to minor alterations of electrical connections within accessible electrical junction boxes or the installation of new electrical wiring, which often requires remodeling and/or refinishing.

Further, the replacement, repair, or alteration of the functionality of existing electrical wiring devices such as electrical outlets or switches connected to a mains power source is often performed by a journeyman due to safety concerns and/or uncertainty regarding proper wiring configurations.

SUMMARY

A network is disclosed, in accordance with one or more illustrative embodiments of the present disclosure. In one illustrative embodiment, the network includes a first device control assembly electrically connected to a power distribution panel. In another illustrative embodiment, the first device control assembly is configured to regulate a load. In another illustrative embodiment, the network includes at least one second device control assembly electrically connected to a power distribution panel. In another illustrative embodiment, the first device control assembly is in data communication with the at least one second device control assembly. In another illustrative embodiment, the first device control assembly regulates the load based on the data communication from the at least one second device control assembly.

A network is disclosed, in accordance with one or more illustrative embodiments of the present disclosure. In one illustrative embodiment, the network includes a first device control assembly. In another illustrative embodiment, the first device control assembly is removably connected to a first backplate. In another illustrative embodiment, the backplate facilitates electrical connectivity between the first device control assembly and the power distribution panel. In another illustrative embodiment, the first device control assembly is configured to regulate a load. In another illustrative embodiment, the network includes at least one second device control assembly electrically connected to the power distribution panel. In another illustrative embodiment, the at least a second device control assembly is removably connected to at least one second backplate. In another illustrative embodiment, the at least one second backplate facilitates electrical connectivity between the at least one second device control assembly and the power distribution panel. In another illustrative embodiment, the first device control assembly is in data communication with the at least one second device control assembly. In another illustrative embodiment, the first device control assembly regulates the load based on the data communication from the at least one second device control assembly.

A system is disclosed, in accordance with one or more illustrative embodiments of the present disclosure. In one illustrative embodiment, the system includes a first backplate electrically connected to a power distribution panel. In another illustrative embodiment, the first backplate is configured to removably connect to a first device control assembly. In another illustrative embodiment, the first backplate facilitates an electrical connection between the first device control assembly and the power distribution panel. In another illustrative embodiment, the first device control assembly is configured to regulate a load. In another illustrative embodiment, the system includes at least one second backplate electrically connected to the power distribution panel. In another illustrative embodiment, the at least a second backplate is configured to removably connect to at least one second device control assembly. In another illustrative embodiment, the at least one second backplate facilitates an electrical connection between the at least one second device control assembly and the power distribution panel. In another illustrative embodiment, the first and the at least one second backplates are adapted to facilitate data communication between the first device control assembly and the at least one second device control assembly to form a network. In another embodiment, the first device control assembly regulates the load based on the data communication with the at least one second backplate.

BRIEF DESCRIPTION OF DRAWINGS

The numerous advantages of the disclosure may be better understood by those skilled in the art by reference to the accompanying figures in which:

FIG. 1A is an exploded view of a modular control unit configured to mount within an electrical junction box, in accordance with one or more embodiments of the present disclosure.

FIG. 1B is an exploded view of two backplates 130 mounted to a 2-gang electrical junction box 102, in accordance with one or more embodiments of the present disclosure. For example, two backplates 130 mounted in the 2-pang electrical junction box 102 may accept two device control assemblies 110 and a 2-opening faceplate 104.

FIG. 2 is an isometric view of a device control assembly, in accordance with one or more embodiments of the present disclosure.

FIG. 8B is a table summarizing the pairings between device control assemblies, electrically-connected luminaires, network-connected luminaires, and sensors in a configurable network, in accordance with one or more embodiments of the present disclosure.

FIG. 8C is a table summarizing physical pairings and addressable pairings between device control assemblies and electrically-connected luminaires in a configurable network, in accordance with one or more embodiments of the present disclosure.

FIG. 8D is a table summarizing the state diagram of electrically-connected luminaires in a configurable network, in accordance with one or more embodiments of the present disclosure.

DETAILED DESCRIPTION

Figure 3A:
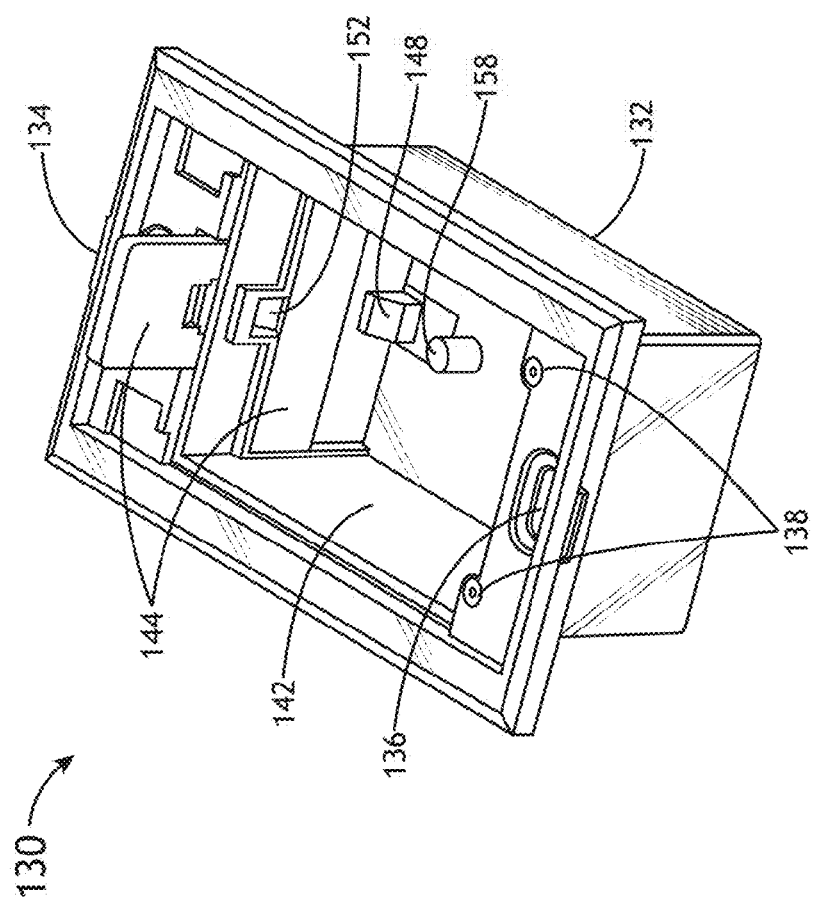
FIG. 3A is an isometric view of a backplate with backplate contacts shielded by an air gap actuator, in accordance with one or more embodiments of the present disclosure.

Reference will now be made in detail to the subject matter disclosed, which is illustrated in the accompanying drawings.

Referring generally to FIGS. 1 through 8D, a configurable network of device controllers is described, in accordance with one or more embodiments of the present disclosure. Embodiments of the present disclosure are directed to the formation of a network of device controllers. Additional embodiments of the present disclosure are directed to pairing device controllers with one or more loads in which a device controller regulates one or more paired loads. Additional embodiments are directed to device controllers in a configurable network configured to regulate any load connected to any other device controllers on the configurable network. Further embodiments are directed to a network of backplates electrically connected to mains power to facilitate a network of modular device controllers.

It is recognized herein that an electrical wiring system of a building typically includes multiple electrical circuits to route electrical power from a power source (e.g. mains power) to multiple electrical junction boxes located throughout the building. Typically, power cables containing electrical wires are routed from a power distribution panel such as, but not limited to, an electrical fuse box, to the multiple electrical junction boxes. The electrical junction boxes may further facilitate electrical connections between the power distribution panel and one or more electrical devices or device controllers by providing an enclosure in which the electrical devices may be connected to, or otherwise terminate, the electrical wires provided by the power cable. An electrical junction box may additionally provide structural support for mounting an electrical device.

The topology of the configuration of wires between junction boxes as well as the number of wires routed between junction boxes may vary depending on the anticipated function of electrical devices to be installed within the junction boxes. Further, power cables associated with an electrical wiring system are typically routed between joists associated with walls and ceilings of the building and are typically secured according to building and electrical codes. Accordingly, modifications of the configuration and number of wires between electrical boxes may be difficult and/or undesirable.

Embodiments of the present disclosure are directed to a configurable network of device controllers connected to the electrical wiring system and further in data communication to provide control over the regulation of electrical loads. In this regard, data communication between device controllers supplements and/or expands the capabilities of wired electrical connections associated with the electrical wiring system to provide fully customizable control over load regulation. Further, embodiments of the present disclosure are directed to incorporating additional devices (e.g. sensors, luminaires, electrical appliances, or the like) to the configurable network of device controllers. Additional embodiments of the present disclosure are directed to modular device controllers with interchangeable functional units for flexible modification of the configurable network of device controllers.

FIG. 1A is an exploded view of a modular control unit 100 configured to mount within an electrical junction box 102, in accordance with one or more embodiments of the present disclosure. In some embodiments, the modular control unit 100 includes a backplate 130 configured to mount within an electrical junction box 102 and provide an electrical connection to an electrical wiring system. In some embodiments, a modular control unit 100 includes a device control assembly 110 to control one or more load devices and is configured to removably couple with the backplate 130. Further, the modular control unit 100 may include a faceplate 104 configured to cover the electrical junction box 102. In this regard, a backplate 130 may provide a standardized mounting assembly for device control assemblies 110. Further, device assemblies 110 may be removably and/or interchangeably connected to the electrical wiring system through the backplate 130.

For the purposes of the present disclosure, a load device may include any device directly or indirectly attached to the electrical wiring system. For example, a load device may include a wired load such as, but not limited to, a luminaire or a fan. As an additional example, a load device may include an electrical outlet into which loads may be removably connected.

In some embodiments, a device control assembly 110 includes electrical circuitry and/or mechanical components to actuate, regulate, or otherwise control one or more load devices connected to the electrical wiring system. For example, a device controller 110 may include, but is not limited to, one or more input devices, one or more buttons, mechanical switches, one or more electrical relays, one or more MOSFETs (metal-oxide-semiconductor field-effect transistors) or one or more TRIACs (triode for alternating current). In this regard, a device control assembly 110 may include, but is not limited to, a toggle switch, a dimmer switch, an alternating current (AC) electrical outlet, a direct current (DC) electrical outlet (e.g. a universal serial bus (USB) outlet), or a multi-function keypad. Additionally, a device controller assembly 110 may include, but is not limited to, one or more display devices, one or more speakers, one or more microphones, or one or more sensors.

In some embodiments, the backplate 130 is configured to electrically connect to an electrical wiring system through the electrical junction box 102. For example, the backplate 130 may connect to a power distribution panel through an electrical wiring system terminated at the electrical junction box 102. Additionally, the backplate 130 may be configured to terminate a power cable with any number of conductors such as, but not limited to, a two-conductor power cable, a three-conductor power cable, or a four-conductor power cable. It is noted herein that the backplate 130 may be compatible with any electrical wiring system in any configuration. For example, the backplate 130 may, but is not limited to, be configured to accept a wire connected to a ground source (e.g. a "ground" wire), a wire connected to a power source (e.g. a "hot" wire), a wire connected to a neutral bar (e.g. a "neutral" wire), or one or more additional wires (e.g. one or more "traveler" wires). Further, the backplate 130 may be configured to accept any gauge of wire. In some embodiments, the backplate 130 accepts 14-gauge wire (e.g. from a 14/2 power cable or a 14/3 power cable). In some embodiments, the backplate 130 accepts 12-gauge wire (e.g. from a 12/2 power cable or a 12/3 power cable). It is recognized herein that electrical systems may include any number of switches or connections between components. As such, the description of electrical wiring systems above is presented solely for illustrative purposes and should not be interpreted as limiting.

A backplate 130 may be electrically connected to an electrical wiring system through the electrical junction box 102. In some embodiments, a backplate 130 is configured to connect to an electrical wiring system through twist-on wire connectors. For example, a backplate 130 may include one or more wires suitable for connecting to a power cable through twist-on wire connectors. In some embodiments, the backplate 130 is configured to connect to an electrical wiring system through push-in wire connectors. For example, a backplate 130 may include one or more push-in connectors to connect to conductors in a power cable such as, but not limited to, a "hot" wire, a "neutral" wire, a "ground" wire, or a "traveler" wire.

In some embodiments, a backplate 130 is configured to interchangeably couple to device control assemblies 110 without modification of the connection between the backplate 130 and the electrical wiring network. For example, a device control assembly 110 configured to operate as a toggle switch may be removed and replaced with a device control assembly configured to operate as a dimmer switch without modification to the backplate 130 or the associated electrical connections to the electrical wiring network. In this regard, the modular control unit 100 provides a semi-permanent element (e.g. a backplate 130 attached to an electrical junction box 102 via one or more screws) connected to the electrical wiring system and interchangeable functional units (e.g. a device control assembly 110).

In some embodiments, a device control assembly 110 may be inserted into or removed from a backplate 130 while a backplate 130 is connected to live power from the electrical wiring assembly. For example, an electrical connection established between a backplate 130 and a device control assembly 110 may be configured to establish a ground connection prior to establishing a "hot" wire connection.

A backplate 130 may be configured to occupy one or more device positions within an electrical junction box 102. In some embodiments, a backplate 130 is configured to occupy one position within an electrical junction box 102. In this manner, a single backplate 130 may be mounted to a 1-gang electrical junction box 102, two backplates 130 may be mounted to a 2-gang electrical junction box 102, or the like. FIG. 1B is an exploded view of two backplates 130 mounted to an electrical junction box 102, in accordance with one or more embodiments of the present disclosure. For example, two backplates 130 mounted in a 2-gang electrical junction box 102 may accept two device control assemblies 110 and a 2-opening faceplate 104. Further, a backplate 130 may be mounted to an electrical junction box 102 alongside one or more additional devices. For example, a backplate 130 and a typical light switch may be mounted within 2-gang electrical junction box 102. In some embodiments, a backplate 130 is configured to occupy two or more positions within an electrical junction box 102. For example, a single backplate 130 may be configured to accept two or more device control assemblies 110 such that each device control assembly 110 effectively occupies a single position within the electrical junction box 102. As an additional example, a backplate 130 occupying two or more positions within an electrical junction box 102 may accept one or more device control assemblies 110 of any size. In this regard, a single device control assembly 110 may effectively occupy any portion of an electrical junction box 102.

In some embodiments, the modular control unit 100 includes a faceplate 104 to cover a portion of the electrical junction box 102 not covered by the backplate 130 or the device control assembly 110. In some embodiments, the faceplate 104 includes one or more openings 106 to provide access to one or more elements of the device control assembly 102. For example, the faceplate 104 may include, but is not limited to, one or more openings 106 to provide access to one or more displays, one or more speakers, one or more microphones, one or more antennas, or one or more sensors associated with a device control assembly 110. In some embodiments, the faceplate 104 provides access to one or more elements of the device control assembly 110 while covering exposed areas of the electrical junction box 102. For example, a device control assembly 110 and/or a backplate 130 attached to an electrical junction box 102 may leave one or more areas of the electrical junction box 102 exposed. In this regard, a faceplate 104 may cover the one or more exposed areas of the electrical junction box 102.

FIG. 2 is an isometric view of a device control assembly 110, in accordance with one or more embodiments of the present disclosure. In some embodiments, the device control assembly 110 includes a user interface 112 to accept one or more input signals. For example, the user interface 112 may include, but is not limited to, a touch-sensitive display. In some embodiments, the device control assembly 110 includes a sensor panel 114 for housing one or more sensors. For example, the sensor panel 114 may, but is not limited to, house a microphone, a speaker, and/or an occupancy sensor. In some embodiments, the user interface 112 and/or the sensor panel 114 are exposed (e.g. to a user) through the one or more openings 106 of the faceplate 104.

In some embodiments, the device control assembly 110 includes a casing 116 to enclose one or more electronic and/or mechanical components (e.g. components associated with the user display 112, components associated with load regulation, one or more sensors within the sensor panel 114, or the like). In some embodiments, the casing 116 provides a sealed enclosure. Further, access to contents within the casing 116 may be provided via one or more removable panels (not shown).

In some embodiments, the device control assembly 110 includes one or more contact pads 118 to provide an electrical connection from the backplate 130 to the electronic components within the casing 116. In this regard, the device control assembly 110 may be connected to the electrical wiring system through the backplate 130. The contact pads 118 may be formed from any material known in the art suitable for providing an electrical connection between the device control assembly 110 and the backplate 130 such as, but not limited to, brass. In some embodiments, the device control assembly 110 includes one or more locking features 120 for securing the device control assembly 110 to the backplate 130 when an electrical connection between the device control assembly 110 and the backplate 130 is established.

Referring to FIGS. 3A through 3G, in some embodiments, a backplate 130 is configured to interchangeably receive device control assemblies 110. In some embodiments, the backplate 130 includes a casing 132 forming a partially enclosed opening 142 to receive a device control assembly 110. In some embodiments, the backplate 130 includes a mounting plate 134. The mounting plate 134 may include one or more mounting holes 136 configured to align with corresponding mounting holes on an electrical junction box 102 (e.g. see FIG. 1). Further, a backplate 130 may be mounted to an electrical junction box 102 by one or more screws via the one or more mounting holes 136. In this regard, the backplate 130 may be semi-permanently mounted to an electrical junction box 102.

The mounting plate 134 may be secured to the casing 132 by any mechanism known in the art. For example, the mounting plate 134 may be secured to the casing 132 through one or more screws 138. As another example, the mounting plate 134 may be secured to the casing 132 using one or more catches. In this regard, a mounting plate 134 may "snap" onto the casing 132. As a further example, a backplate 130 may include a combined mounting plate 134 and casing 132 such that the mounting plate 134 and casing 132 are formed from a continuous piece of the same material.

Figure 3B:
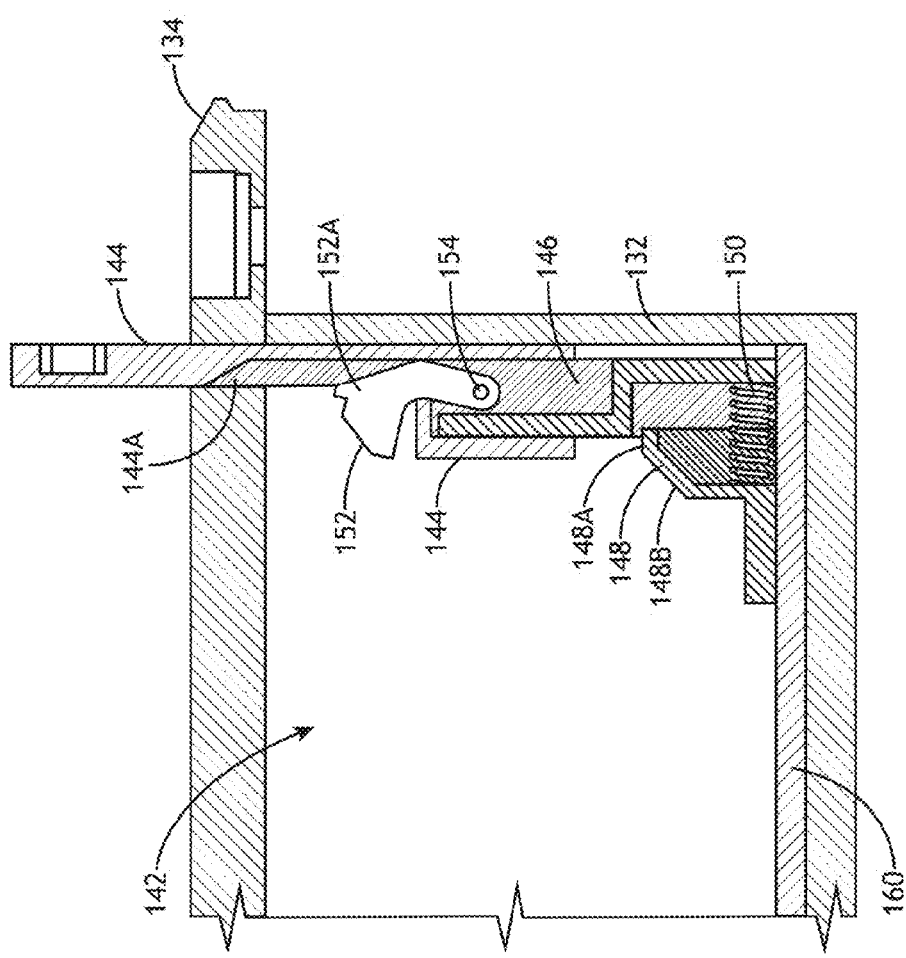
FIG. 3B is a cross-sectional view of a backplate with backplate contacts shielded by an air gap actuator, in accordance with one or more embodiments of the present disclosure.
Figure 3C:
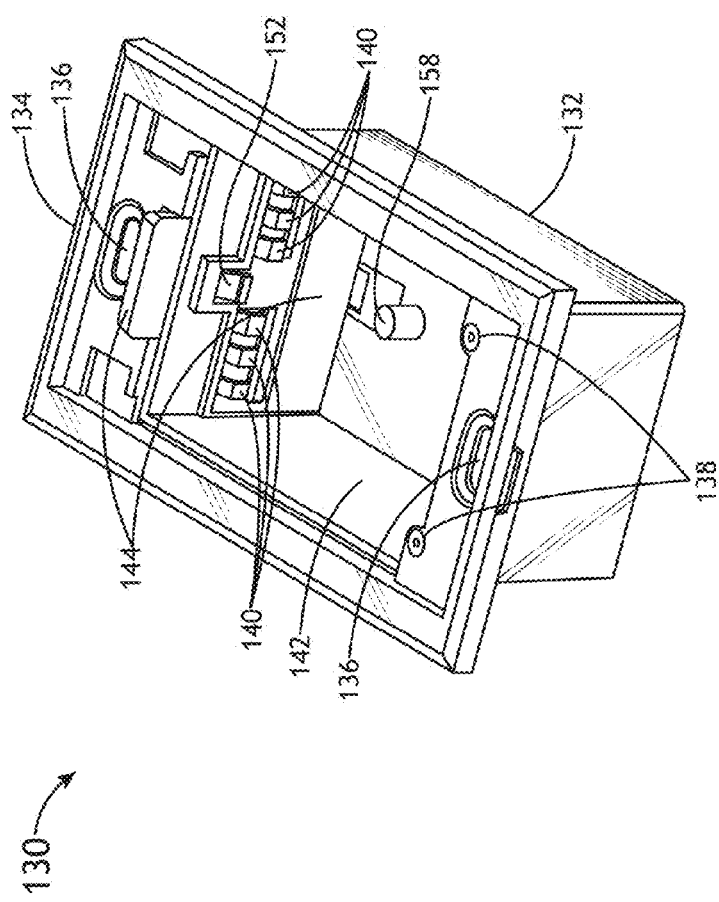
FIG. 3C is an isometric view of a backplate with backplate contacts available to an inserted device control assembly (not shown), in accordance with one or more embodiments of the present disclosure.
Figure 3D:
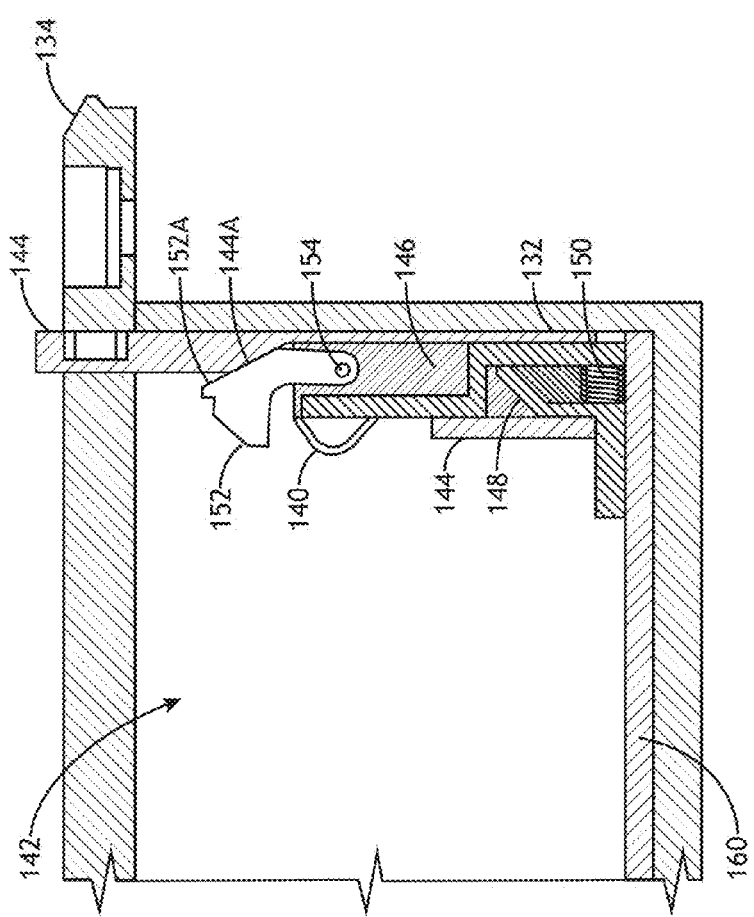
FIG. 3D is a cross-sectional view of a backplate with backplate contacts available to an inserted device control assembly (not shown), in accordance with one or more embodiments of the present disclosure.
Figure 3E:
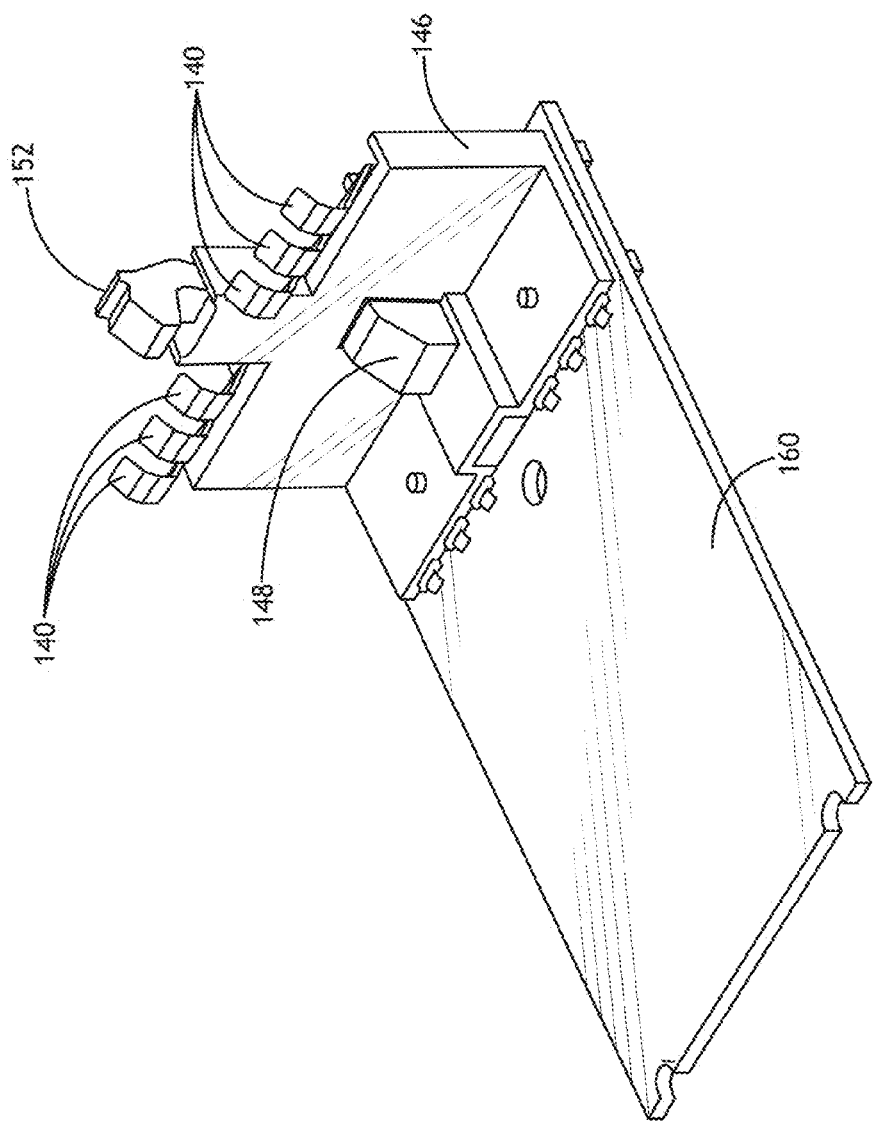
FIG. 3E is an isometric view of a backplate board assembly to mount the backplate contacts, in accordance with one or more embodiments of the present disclosure.
Figure 3F:
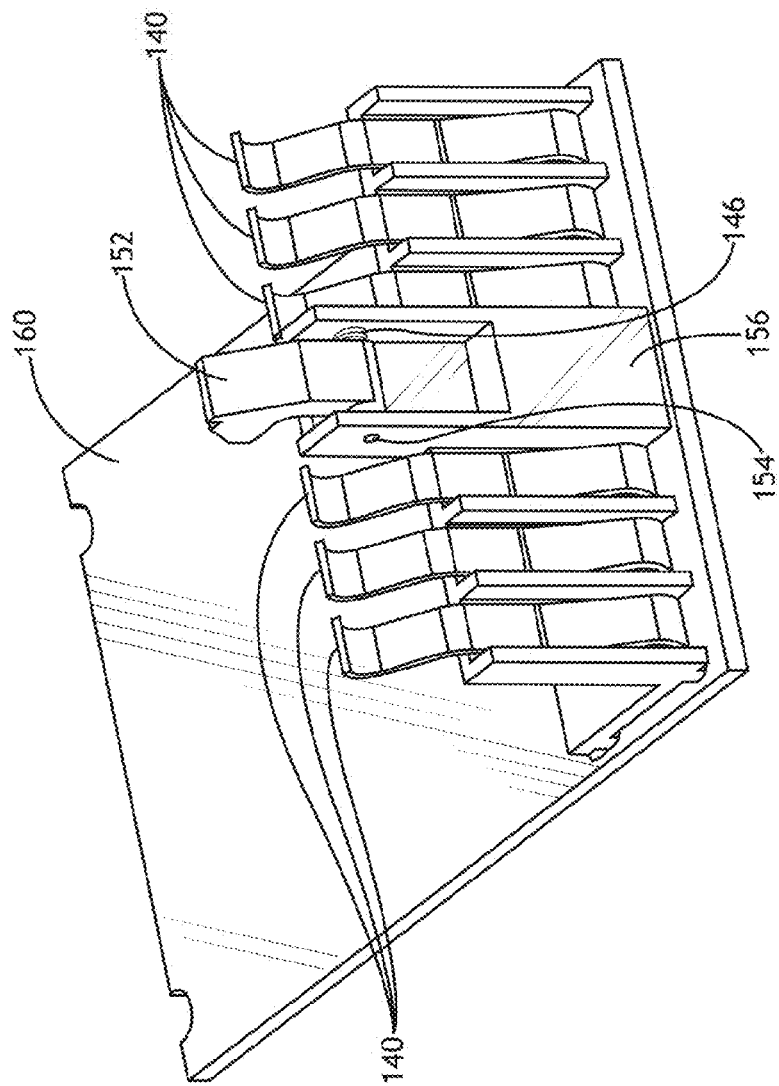
FIG. 3F is an isometric view of a backplate board assembly illustrating a locking lever, in accordance with one or more embodiments of the present disclosure.

In some embodiments, the backplate 130 includes one or more backplate contacts 140 to provide one or more electrical connections between an electrical wiring assembly (e.g. one or more power cables) and the one or more contact pads 118 of an inserted device control assembly 110. In some embodiments, the one or more backplate contacts 140 are shielded (e.g. from a user) when no device control assembly 110 is present. In this regard, access to the backplate contacts 140 and, consequently, access to the electrical wiring system, is provided solely upon insertion of a device control assembly 110. FIGS. 3A and 3B are isometric and cross-sectional views of a backplate 130 with backplate contacts 140 shielded by an air gap actuator 144, in accordance with one or more embodiments of the present disclosure. It is noted herein that the views presented in FIGS. 3A and 3B may illustrate a backplate 130 without an inserted device control assembly 110. FIGS. 3C and 3D are isometric and cross-sectional views, respectively, of a backplate 130 with backplate contacts 140 available to an inserted device control assembly 110 (not shown for clarity). In this regard, the views presented in FIGS. 3C and 3D illustrate the coupling of the backplate 130 to an inserted device control assembly (not shown). In this regard, the backplate contacts 140 illustrated in FIGS. 3C and 3D are not exposed (e.g. to a user). FIG. 3E is an isometric view of a backplate board assembly 146 to mount the backplate contacts 140. FIG. 3F is an isometric view of a backplate board assembly 146 illustrating a locking lever 152, in accordance with one or more embodiments of the present disclosure.

In some embodiments, the air gap actuator 144 provides access to backplate contacts 140 while engaged in an open position (see FIGS. 3C and 3D) and is further configured to prohibit access to backplate contacts 140 while engaged in a closed position (see FIGS. 3A and 3B). The air gap actuator 144 may translate between a closed position and an open position to regulate access to the backplate contacts 140.

In some embodiments, a position of the air gap actuator is maintained through friction associated with one or more adjacent elements (e.g. the casing 132). In some embodiments, the air gap actuator 144 is held in tension (e.g. by a spring) to force the air gap actuator 144 to remain in the closed position unless a counter-force is applied. In this regard, a force must be applied to translate the air gap actuator 144 from a closed position to an open position. In some embodiments, the position of the air gap actuator 144 is governed by a bi-stable system (not shown). For example, the air gap actuator 144 may be connected to a spring and one or more ratchets such that the air gap actuator 144 may be locked in either the open or a closed position. In this regard, an air gap actuator 144 in a closed position and held in tension by a spring may be transitioned to an open position by depressing the air gap actuator 144 past a center-point of a ratchet such that the ratchet locks the air gap actuator 144 in the open position. Similarly, the air gap actuator 144 locked in the open position may be transitioned to and locked in the closed position by depressing the air gap actuator 144 past a center-point of a ratchet.

The air gap actuator 144 may be formed from any material known in the art suitable for insulating electrical contacts. For example, the air gap actuator 144 may, but is not limited to, include acrylic, acetal, A.B.S. (acrylonitrile, butadiene, and styrene), polystyrene, nylon, P.E.T. (polyethylene terephthalate), polycarbonate, polyurethane, PVC, or PTFE (poly-tetra-fluoro-ethylene).

In some embodiments, a backplate contact 140 is formed from a conducting material such as, but not limited to, brass. In some embodiments, a backplate contact 140 maintains electrical contact with a contact pad 118 of a device control assembly 110 through pressure. In some embodiments, a backplate contact 140 is mounted to the backplate board assembly 146 in a cantilevered configuration. For example, a cantilevered portion of a backplate contact 140 may extend to a position in the opening 142 of the casing 132 (e.g. see FIG. 3D). In this regard, a device control assembly 110 inserted into the opening 142 of the casing 132 will provide pressure between the one or more contact pads 118 and the one or more backplate contacts 140 to establish and/or maintain an electrical connection. Further, the one or more backplate contacts 140 may be connected to the electrical wiring assembly through a circuit board 160.

In some embodiments, the backplate 130 includes an air gap actuator lock 148 configured to regulate the movement of the air gap actuator 144. In some embodiments, the air gap actuator lock 148 is configured to translate between a locked position and an unlocked position. In some embodiments, a spring 150 is connected to the backplate board assembly 146 and the air gap actuator lock 148 to force the air gap actuator lock 148 into a locked position unless a counter-force is applied. In this regard, a force must be applied to translate the air gap actuator lock 148 to an unlocked position.

In some embodiments, the air gap actuator lock 148 includes a top portion 148A configured to prevent the air gap actuator 144 from translating to the open position (e.g. to expose the electrical contacts 136) when the air gap actuator lock 148 is locked. In some embodiments, translation of the air gap actuator lock 148 to the unlocked position provides clearance for the air gap actuator 144 to translate to the open position.

In some embodiments, the air gap actuator lock 148 includes a graded portion 148B to provide contact with a device control assembly 110 during coupling between the device control assembly 110 and the backplate 130. For example, contact between the casing 116 of the device control assembly 110 and the graded portion of the air gap actuator lock 148 may cause the air gap actuator lock 148 to slideably translate from a locked position to an unlocked position. The graded portion 148B of the air gap actuator lock 148 may have any shape suitable for translating the air gap actuator lock 148 to a locked position upon insertion of a device control assembly 110 such as, but not limited to a flat graded surface (e.g. a surface at a 45 degree angle relative to the translation direction) or a curved surface.

In some embodiments, the backplate 130 includes a locking lever 152 to secure a device control assembly to the backplate 130 when the air gap actuator 144 is in an open position (e.g. the backplate contacts 140 are in connection with the contact pads 118 of the device control assembly 110). For example, the locking lever 152 may couple to locking features 120 to secure an inserted device control assembly 110 to the backplate 130. In some embodiments, the locking lever 152 is mounted to a rod 154 on the backplate board assembly 146 and held in tension against the air gap actuator 144 via a torsion spring 156. Further, the motion of the locking lever 152 may be governed by the position of the air gap actuator 144. For example, the air gap actuator 144 may include a graded portion 144A to couple with a graded portion 152A of the locking lever 152. In this regard, the locking lever 152 may rotate to provide clearance for a device control assembly 110 (not shown) when the air gap actuator 144 is in a closed position (e.g. as illustrated in FIG. 3B). Similarly, the locking lever 152 may be rotated to couple with locking features 120 of a device control assembly 110 (not shown) as the air gap actuator 144 translates to an open position (e.g. as illustrated in FIG. 3D).

In some embodiments, the casing 132 includes one or more keyed features 158 to facilitate alignment of a device control assembly 110 into a backplate 130. For example, the one or more keyed features 158. The one or more keyed features 158 may be of any type known in the art. For example, the one or more keyed features 158 may include, but are not limited to, raised features, recessed features, or grooves. In some embodiments, a keyed feature 158 is a raised feature with a height equal to or greater than a height of the air gap actuator lock 148 in a locked position. In this regard, air gap actuator lock 148 is accessible to objects with one or more corresponding keyed features (e.g. keyed features on a device control assembly 110).

Figure 3G:
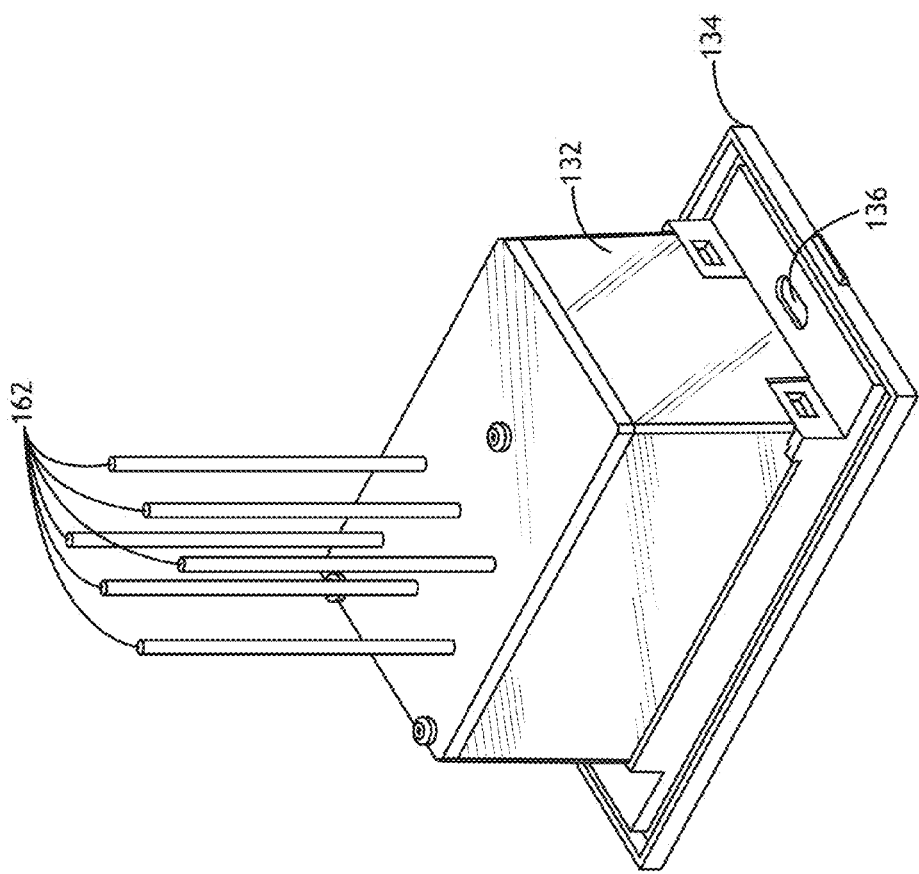
FIG. 3G is an isometric view illustrating the back side of a backplate, in accordance with one or more embodiments of the present disclosure.

FIG. 3G is an isometric view illustrating the back side of a backplate 130, in accordance with one or more embodiments of the present disclosure. In some embodiments, the backplate 130 includes one or more connection wires 162 to provide one or more electrical connections between the one or more backplate contacts 140 and the electrical wiring system (e.g. one or more power cables). For example, the one or more connection wires 162 may connect directly to the one or more backplate contacts 140. As another example, the one or more connection wires 162 may connect to a circuit board 160. In this regard, the backplate 130 may include one or more power control elements (one or more resistors, one or more capacitors, one or more transistors, one or more diodes, one or more TRIACs, or the like) to monitor or manipulate the flow of electricity between an installed device control assembly 110 and the electrical wiring system.

In some embodiments, the one or more connection wires 162 may connect to one or more conductors associated with one or more power cables via twist-on wire connectors. In some embodiments, although not shown, the backplate 130 includes one or more push-in wire terminals to provide a connection to the electrical wiring system. In this regard, one or more conductors associated with one or more power cables may be inserted into the push-in wire terminals to provide an electrical connection between the backplate 130 and the electrical wiring system.

Figure 4:
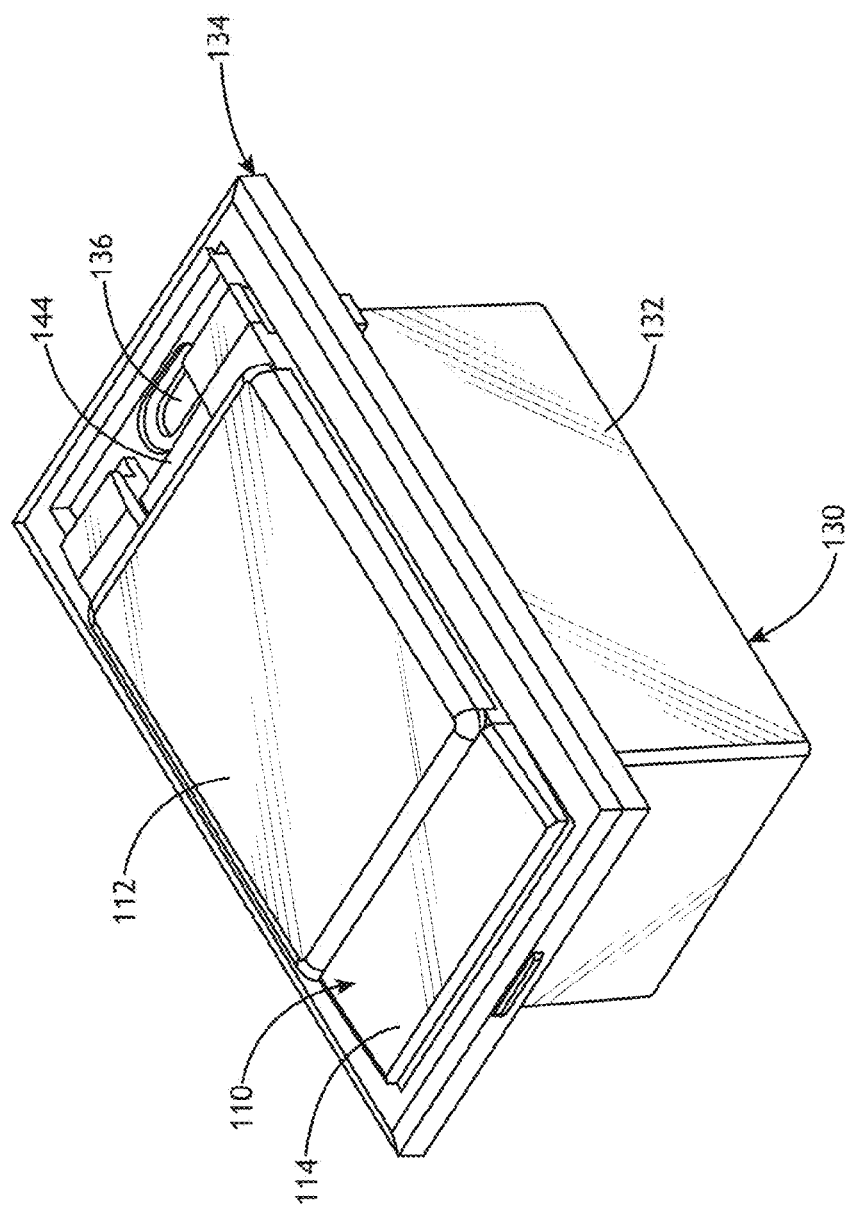
FIG. 4 is an isometric view of a device control assembly coupled to a backplate, in accordance with one or more embodiments of the present disclosure.

FIG. 4 is an isometric view of a device control assembly 110 coupled to a backplate 130, in accordance with one or more embodiments of the present disclosure. In some embodiments, the device control assembly 110 securely fits within the opening 142 of the backplate 110 such that all electrical connections (e.g. the backplate contacts 140 and the contact pads 118) are inaccessible (e.g. to a user).

It is noted herein that the above description of the modular control unit 100 is provided for illustrative purposes only and should not be interpreted as limiting. For example, the modular control unit 100 may include any combination of a device control assembly 110 and a faceplate 104 or a backplate 130. In some embodiments, the modular control unit 100 includes a device control assembly 110 and a faceplate 106. In this regard, the device control assembly 110 is configured to connect with the electrical wiring system without a baseplate 130. In some embodiments, the modular control unit 100 includes a device control assembly 110 and a backplate 130. In this way, the device control assembly 110 fully covers the electrical junction box when coupled with a backplate 130. In some embodiments, the modular control unit 100 includes a device control unit 110 configured to directly connect to the electrical wiring system and fully cover the electrical box.

Figure 5:
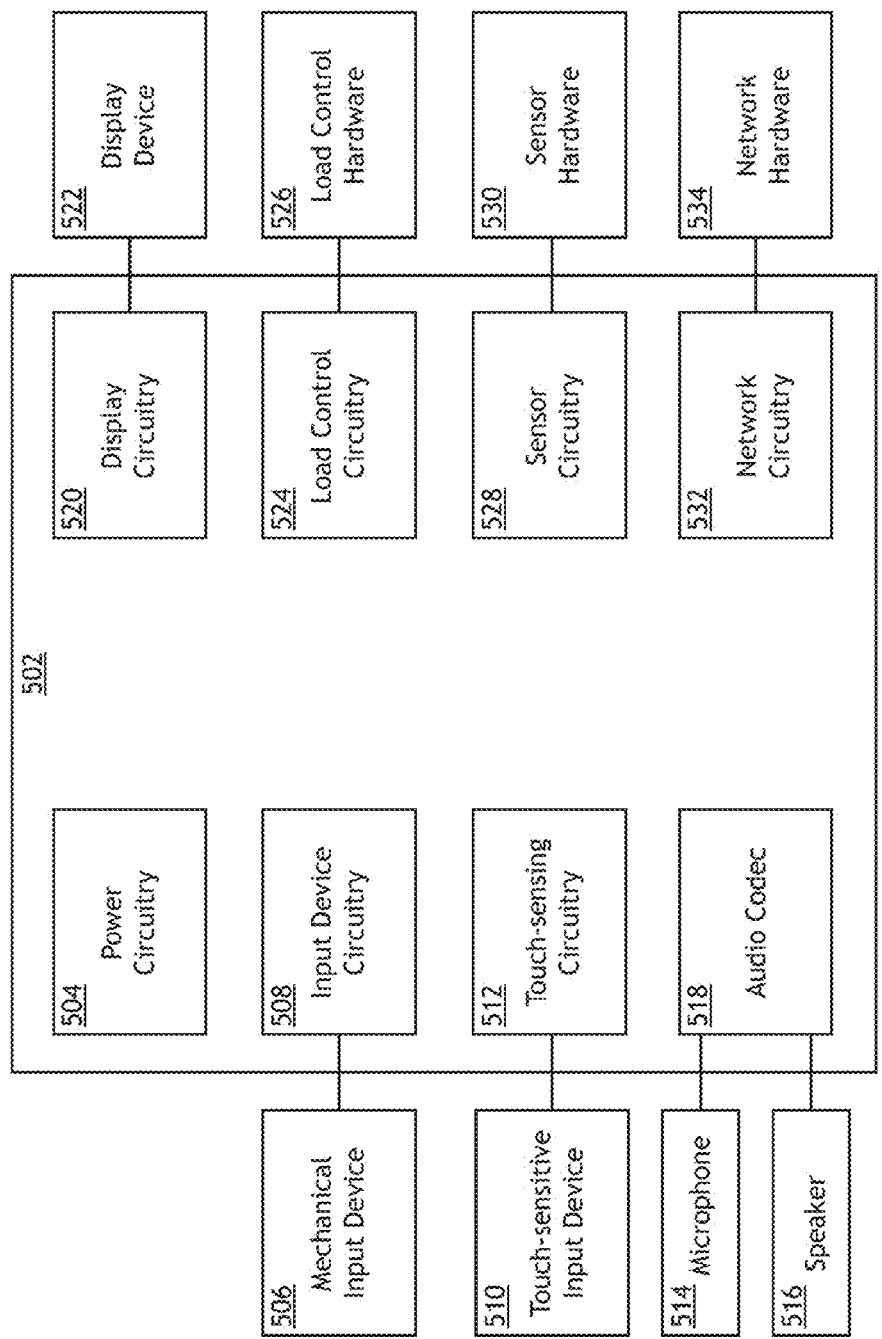
FIG. 5 is a block diagram of components of a device control assembly, in accordance with one or more embodiments of the present disclosure

FIG. 5 is a block diagram of components of a device control assembly 110, in accordance with one or more embodiments of the present disclosure. In some embodiments, a device control assembly 110 includes power circuitry 504. For example, the device control assembly may include elements to control the distribution of electrical power within the device control assembly including, but not limited to, a voltage regulator or an AC to DC converter to convert AC electrical power from the electrical wiring system to DC power suitable for powering one or more components on a circuit board 160.

In some embodiments, a device control assembly 110 includes control circuitry 502. In some embodiments, the device control assembly 110 includes a mechanical input device 506. For example, a device control assembly 110 may include, but is not limited a toggle switch, a button, or a dome switch. In some embodiments, the mechanical input device provides tactile feedback when actuated. In some embodiments, mechanical input device 506 provides audible and/or tactile (haptic) feedback when actuated. In this regard, actuation of the mechanical input device 506 is broadcast (e.g. to a user). In some embodiments, the mechanical input device 506 is coupled to input device circuitry 508 to provide an input signal associated with actuation of the mechanical input device 506.

In some embodiments, a device control assembly 110 includes a touch-sensitive input device 510 coupled with touch-sensing circuitry 512. The touch-sensitive input device 510 provides a means for user input in which a user may contact (e.g. with a finger) a portion of the touch-sensitive input device 510 to generate an input signal. The touch-sensitive input device 510 may include any touch-sensitive input device 510 known in the art including, but not limited to, capacitive-type or resistive-type devices. Further, the input signal may provide information to the control circuitry 502 such as, but not limited to, a number of contact points on the touch-sensitive device 510 (e.g. a number of fingers in contact), a location of one or more contact points on the touch-sensitive input device 510, or a pressure of one or more contact points.

In some embodiments, a device control assembly 110 includes at least one of a microphone 514 or a speaker 516 coupled with an audio codec 518. In this regard, the device control assembly 110 may accept and/or emit audio signals.

In some embodiments, a device control assembly 110 includes a display device 522 coupled to display circuitry 520 for driving the display device 522. The display device 522 may be any type of display device known in the art suitable for displaying visual information including, but not limited to, a light-emitting diode (LED), a LED display, an organic light-emitting diode (OLED) display, a liquid crystal display (LCD), a thin-film transistor (TFT) display, or an electronic ink (E-ink) display. In some embodiments, the display device 522 uses a deadfronting technique to display visual information. For example, images printed with an opaque medium positioned adjacent to a semi-transparent medium may only appear visible when illuminated with a backlight (e.g. a LED backlight). In some embodiments, the display device 522 and the touch-sensitive input device 510 are integrated into a single unit (e.g. a user interface 112).

In some embodiments, the device control assembly 110 includes load control hardware 526 coupled to load-control circuitry 524. In some embodiments, the load control hardware 526 actuates, regulates, or otherwise controls a connected load. As described above, a device control assembly 110 (e.g. as part of a modular control unit 100) connected to a power distribution panel in an electrical wiring system may control the electrical power to load device connected to the electrical wiring system. Accordingly, the load control hardware may include, but is not limited to, one or more mechanical relays, one or more electrical relays, one or more diodes, one or more TRIACs, one or more MOSFETs, one or more resistors, one or more capacitors, or one or more integrated circuits.

For the purposes of the present disclosure, in this regard, a device control assembly 110 provides a physical function. Further, the physical function of a device control assembly (e.g. regulating a current and/or a voltage to a load device) is performed by electrical and/or mechanical elements (e.g. switches, relays, or the like) within the casing 116 of the device control assembly 110. In some embodiments, a device control assembly 110 provides a physical function upon actuation of a user input device (e.g. a mechanical input device 506 or a touch-sensitive input device 510). For example, a device control assembly 110 may operate as a dimmer switch to regulate electrical power to one or more connected luminaires by swiping a finger along a linear path on a touch-sensitive input device 510. In this regard, an input signal generated by the touch-sensing circuitry 512 including a location of a finger contact may determine the relative brightness of the connected luminaires. Further, an input signal generated by the touch-sensing circuitry 512 including a location of a finger contact may determine the color output of a multi-color luminaire.

In some embodiments, the device control assembly 110 includes one or more sensors (e.g. sensor hardware 530) coupled to sensor circuitry 528. For example, a device control assembly 110 may include, but is not limited to, a light sensor, a temperature sensor, a proximity sensor, a pressure sensor, a passive infrared (PIR) sensor, an active infrared sensor, or a thermopile sensor. In this regard, the sensor circuitry 528 may generate one or more sensor input signals associated with an environment proximate to the device control assembly 110. In some embodiments, one or more sensors (e.g. one or more occupancy sensors) determine occupancy of a room in which the device control assembly 110 is located.

In some embodiments, a device control assembly 110 includes network hardware 534 coupled to network circuitry 532 for data communication. In some embodiments, the network circuitry 532 is coupled to an antenna to provide wireless data communication. In this regard, the antenna may be configured to operate in any frequency band known in the art. In some embodiments, the network circuitry and the antenna are configured to operate in a Radio Frequency (RF) band. In this regard, the network circuitry 532 may be compatible with any wireless protocol known in the art, such as, but not limited to, Bluetooth, Bluetooth Low Energy (BLE), WiFi, RFID, Zigbee, Z-Wave, Thread, 802.15.4, or the like. It is noted herein that the antenna (e.g. a portion of the network hardware 534) may be of any type known in the art, including, but not limited to, an embedded antenna or an external antenna.

In some embodiments, the network circuitry 532 is coupled to network hardware 534 to provide wired data communication. In some embodiments, the network circuitry 532 and network hardware 309 provide data communication over one or more electrical wires associated with the electrical wiring system (e.g. one or more wires in a power cable connected to the modular control unit 100). In this regard, the network circuitry 532 may be compatible with any wired protocol known in the art such as, but not limited to, universal powerline bus, X10, LonTalk, Homeplug AV, or Powerline AV.

In some embodiments, a device control assembly 110 forms a configurable network for data communication with one or more devices through the network circuitry 532 and network hardware 534. For example, a device control assembly 110 may form a network including one or more data connection pathways to at least a second device control assembly 110. As another example, a device control assembly 110 may form a network including one or more wireless devices (e.g. one or more wireless sensors, one or more wireless luminaires, one or more wireless electrical sockets, or the like). As a further example, a device control assembly 110 may form a network including one or more wired devices (e.g. one or more powerline devices). Additionally, a device control assembly 110 may form a network with any combination of device control assemblies 110, wireless devices, or wired devices. In this regard, a device control assembly 110 may transmit or receive data over one or more data pathways associated with the configurable network.

It is noted herein that the configurable network may have any topology known in the art including, but not limited to a mesh topology, a star topology, a ring topology, a line topology, or a bus topology. It is further noted herein that data pathways between device control assemblies 110 within the configurable network may include single-hop (e.g. a direct connection) or multi-hop pathways (e.g. a connection including one or more additional nodes to repeat and/or facilitate the data connection). For example, the configurable network may have a flood mesh topology. In this regard, data sent from a first device (e.g. one node) on the network intended for a second device (e.g. a second node) is sent to all nodes on the network. Further, any additional nodes on the network may repeat or retransmit the data such that the data is received by the second device by one or more data pathways. As another example, the configurable network may have a routed mesh topology in which routing information describing data pathways for data communication between nodes of the network is defined and stored (e.g. by any of the nodes on the network or a controller).

The configurable network may include (e.g. as nodes of the network) one or more additional connected devices in addition to device control assemblies 110 such as, but not limited to, sensors, luminaires, or configurable electrical sockets. The connected devices may be connected to the configurable network through wired pathways (e.g. via a data connection provided by power cables associated with the electrical wiring system) or wireless pathways (e.g. via Bluetooth, Bluetooth Low Energy (BLE), WiFi, RFID, Zigbee, Z-Wave, Thread, 802.15.4, or the like). Further, the configurable network may include one or more electrical appliances connected (e.g. via wired or wireless pathways) such as, but not limited to, connected televisions, connected set-top boxes (e.g. Apple TV, Roku, Chromecast, or the like), connected thermostats (e.g. Nest, Ecobee, or the like), or connected speakers audio devices (e.g. Amazon Echo, Sonos, or the like). Additionally, the configurable network may include one or more mobile devices (e.g. phones, tablets, wearable devices, or the like).

In some embodiments, a device control assembly 110 is directed to perform a physical function (e.g. control one or more load devices using load control circuitry 524 coupled to load control hardware 526) by at least one other device (e.g. a second device control assembly 110) on a configurable network via data communication. Accordingly, a device control assembly 110 may have an addressable function in which the device control assembly 110 directs one or more additional device control assemblies to perform their associated physical functions. In some embodiments, the physical and addressable functions of a device control assembly 110 are independent. In this regard, a device control assembly 110 may perform a physical function without actuation of an input device of the device control assembly 110 (e.g. a mechanical input device 506 or a touch-sensitive input device 510).

Similarly, a device control assembly 110 may provide an addressable function by directing at least a second device control assembly 110 to perform a physical function via data communication. For the purposes of the present disclosure, for example, a device control assembly 110 may be configured to direct a second device control assembly to actuate a load (e.g. toggle the state of a connected electrical device) upon actuation of an input device (e.g. a mechanical input device 506 or a touch-sensitive input device 510). In this way, actuation of a device control assembly 110 (e.g. via a mechanical input device 506 or a touch-sensitive input device 510) may cause the regulation of a load device by another device control assembly 110. In this regard, a device control assembly 110 may perform an addressable function without performing a physical function.

In some embodiments, a device control assembly 110 provides multiple functions including one more physical functions and one or more addressable functions. For example, a device control assembly 110 is configured to provide a physical function upon actuation of a first portion of a touch-sensitive input device 510 and is further configured to provide an addressable function upon actuation of a second portion of the touch-sensitive input device 510. In this regard, a device control assembly 110 may operate as a multi-function keypad.

For the purpose of the present disclosure, a device control assembly 110 is paired with a load device if the device control assembly 110 is configured to control the load through a physical or an addressable function. It is noted herein that a device control assembly 110 may be configured to exclusively perform one or more addressable functions by only pairing the device with one or more loads not regulated by a physical function of the device control assembly 110 (e.g. not pairing the device control assembly 110 with a load associated with a physical function).

In some embodiments, pairings between device control assemblies 110 and load devices within a configurable network are dynamically assignable. In some embodiments, device pairings are defined and stored locally on each device control assembly 110 within the network. Accordingly, a device control assembly 110 is physically paired with a load if the device control assembly 110 is configured to regulate electrical power to the load device through load control circuitry 524 and associated hardware 526 (e.g. as a physical function). Similarly, a device control assembly is addressably paired with a load device if the device control assembly 110 is configured to direct one or more additional device control assemblies 110 to regulate the load device through load control circuitry 524 and associated load control hardware 526 of the one or more additional device control assemblies.

In some embodiments, a pairing for a device controller 110 and a load is determined by the device control assembly 110 itself. In some embodiments, pairings between device control assemblies 110 and load devices within a configurable network are determined by a controller associated with the configurable network. The controller may have any type of architecture known in the art such as, but not limited to a centralized architecture or a distributed architecture. In some embodiments, one device controller within the configurable network operates as the controller (e.g. to define, store, and distribute device pairings to device control assemblies 110 on the network). In some embodiments, a controller for assigning device control assembly pairings 110 is distributed. In this regard, one or more device control assemblies 110 operate together as the controller. In a further embodiment, a controller is an element on the network other than a device control assembly such as, but not limited to, a hub, a centralized server, or a distributed server.

In some embodiments, the controller includes one or more processors. Further, the one or more processors may be configured to execute a set of program instructions maintained in a memory medium, or memory. The one or more processors of a controller may include any processing element known in the art. In this sense, the one or more processors may include any microprocessor-type device configured to execute algorithms and/or instructions. In some embodiments, the one or more processors may consist of a stand-alone device hub, a desktop computer, a mainframe computer system, a workstation, or any other computer system (e.g., networked device) configured to execute a program configured to operate the configurable network, as described throughout the present disclosure. It is further recognized that the term "processor" may be broadly defined to encompass any device having one or more processing elements, which execute program instructions from a non-transitory memory medium.

Figure 6:
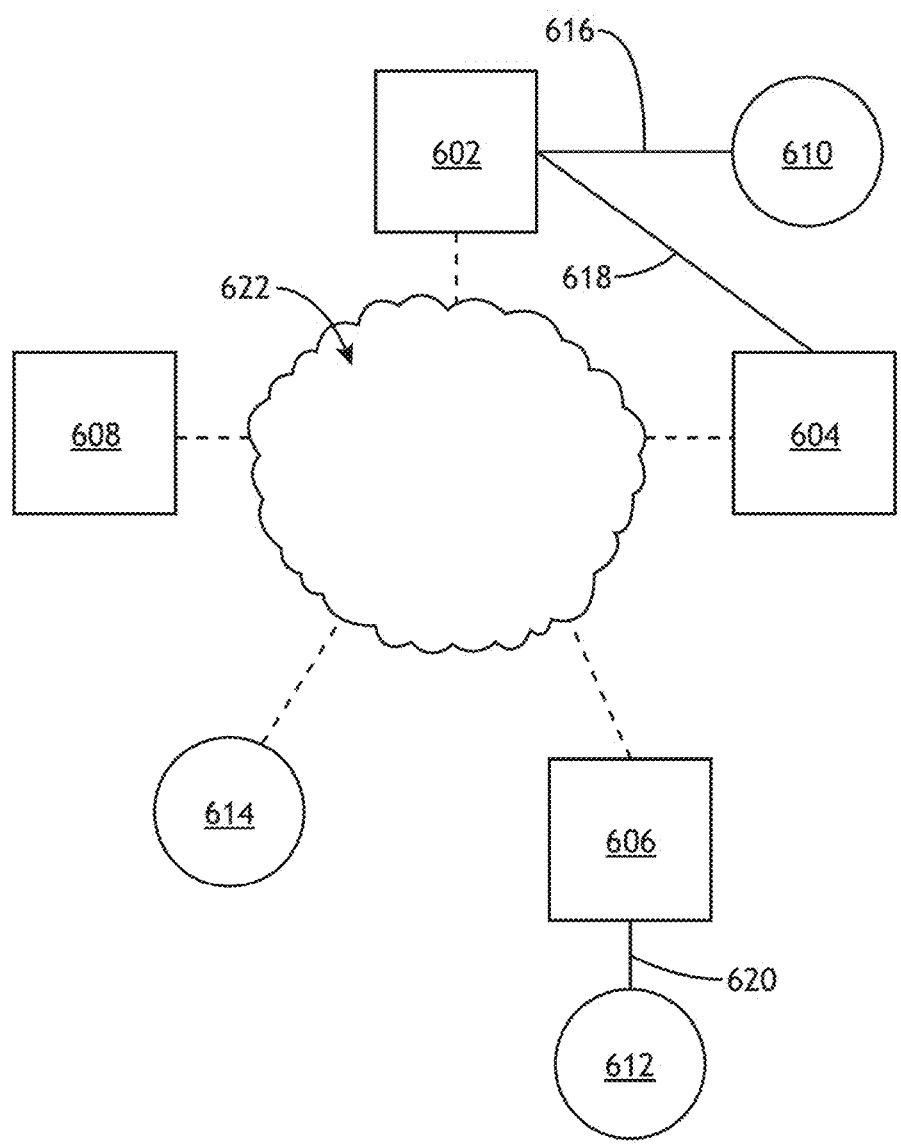
FIG. 6 is a block diagram of a configurable network of modular control unit for actuating one or more load devices, in accordance with one or more embodiments of the present disclosure.

FIG. 6 is a block diagram of a configurable network 600 of modular control unit 100 for actuating one or more load devices, in accordance with one or more embodiments of the present disclosure. It is noted herein that the network 600 described herein is provided solely for illustrative purposes and should not be interpreted as limiting the present disclosure. In some embodiments, device control assemblies 602-608 are communicatively coupled within the network 600 via one or more data connections 622. Further, the network 600 may include one or more load devices 610-614. The load devices may be any type of load devices including, but not limited to, luminaires, fans, or electrical outlets configured to provide power to one or more attached electrical devices.

In some embodiments, device control assembly 606 is physically paired with load device 612 such that actuating device control assembly 110 regulates electrical power to load device 612 via one or more wires 620. In some embodiments, device control assemblies 602 and 604 are physically paired with load device 610. Further, device control assemblies 602 and 604 are connected to load device 610 via wires 616 and 618 in a three-way switch configuration. In this regard, wire 618 may be a "traveler" wire associated with a power cord within an electrical wiring system. In some embodiments, device control assembly 608 is not physically paired with any load device. In some embodiments, load device 614 is not physically paired with any device control assembly 602-608 on the network. Further, load device 614 is directly connected to the configurable network 600 (e.g. via a data pathway 622). Load device 614 may be connected to the configurable network 600 via a wired or wireless data pathway 622.

It is noted herein that pairings between device control assemblies 602-608 and load devices 610-614 may be dynamically modified or updated. For example, device control assembly 608 may be paired with any load device 610-612 on the network. As another example, device control assembly 608 may be paired with load device 612 such that device control assemblies 606 and 608 operate as a three-way switch to control load device 612.

As another example, device control assembly 606 may be paired exclusively with load device 614 and device control assembly 608 may be paired with load device 612. In this regard, device control assembly 608 may provide an addressable function (e.g. controlling load device 614) but not a physical function (e.g. control of load device 612) when actuated. However, device control assembly 606 may facilitate the control of load device 612 by device control assembly 608 via a data pathway 622.

As a further example, device control assembly 602 may be paired with load device 612 and not paired with load device 610. Accordingly, device control assembly 602 may control load device 612 via a data connection 622 to device control assembly 304. Further, device control assemblies 602 and 606 may operate as a three-way switch to control load device 612.

It is noted herein that any number of device pairings between device control assemblies 602-608 and load devices 610-614 may be established via the configurable network 600. Accordingly, the descriptions of pairings above are intended solely for illustrative purposes and should not be interpreted as limiting.

Figure 7:
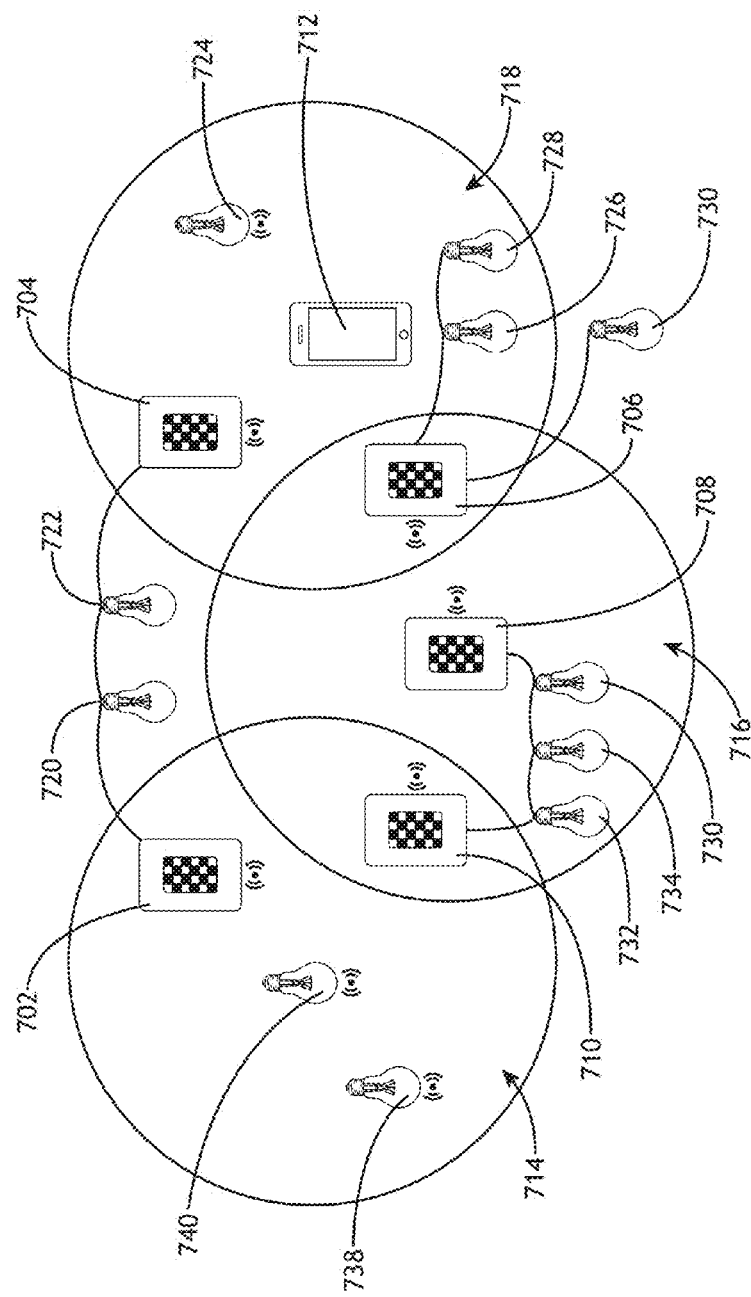
FIG. 7 is an illustration of a configurable network, in accordance with one or more embodiments of the present disclosure.

FIG. 7 is an illustration of a configurable network 700, in accordance with one or more embodiments of the present disclosure. It is noted herein that the network 700 described herein is provided solely for illustrative purposes and should not be interpreted as limiting the present disclosure. In some embodiments, the network includes device control assemblies 702-710 and a connected mobile device 712 (e.g. a phone, a tablet, a wirelessly-connected computer, or the like) configured to control one or more load devices 720-740.

In some embodiments, device control assemblies 702 and 704 are physically paired to load devices 720 and 722 and are configured to operate as a three-way switch. In some embodiments, device control assembly 706 is physically paired to load devices 726-730 and is configured to operate as a multi-function keypad to operate load devices 726-728 and load device 730 independently. In some embodiments, device control assemblies 708 and 710 are physically paired to load devices 732-736 and are configured to operate as a three-way switch. Further, device control assembly 708 is configured to operate as a dimmer switch and device control assembly 710 is configured to operate as a toggle switch. In some embodiments, load devices 724, 738, and 740 are wirelessly connected to the network 700 and are further not physically paired with any device control assembly 702-710.

In some embodiments, device control assemblies 702-710 are wirelessly connected within the network 700 via one or more data pathways. In some embodiments, network circuitry 532 and associated network hardware 534 of the device control assemblies 110 are configured to connect via a Bluetooth Low Energy (BLE) protocol in a mesh network topology (e.g. a flood mesh topology). Further, mobile device 712 and load devices 724, 738, and 740 are nodes within the mesh network 700. In this regard, each node on the mesh network may transmit or retransmit mesh network traffic such that all nodes of the mesh network may communicate (e.g. via single-hop or multi-hop paths). Accordingly, mobile device 712 can be paired with load devices 738 and 740 via the network 700. For example, mobile device 712 may have a data range 718 insufficient to reach load device 738. However, device control assembly 708 may serve as a repeater (e.g. in a flood mesh network). In this regard the data range 716 overlaps with data range 718 of mobile device 712 and data range 714 of load device 738 to provide data communication. In some embodiments, the mobile device 712 connects to a device control assembly (e.g. device control assembly 706) for communication with load devices within the network 700. In this regard, device control assembly 706 may operate as a bridge to communicate data between the mobile device 712 and any device on the network 700. It is noted herein that mobile device 712 or, alternately any connected device (e.g. a connected television, a connected electrical appliance, a wearable device, or the like), may not include appropriate hardware to properly communicate on the network 700. However, a device control assembly (e.g. device control assembly 706) may simultaneously connect with the network 700 on a first protocol (e.g. a flood mesh protocol) and a connected device on a second protocol (e.g. a Bluetooth protocol) to provide a bridge for data communication between the connected device and one or more devices on the network 700.

It is noted herein that any number of device pairings between device control assemblies 702-710, mobile device 712, and load devices 720-740 may be established via the configurable network 700. Accordingly, the descriptions of pairings above are intended solely for illustrative purposes and should not be interpreted as limiting.

Figure 8A:
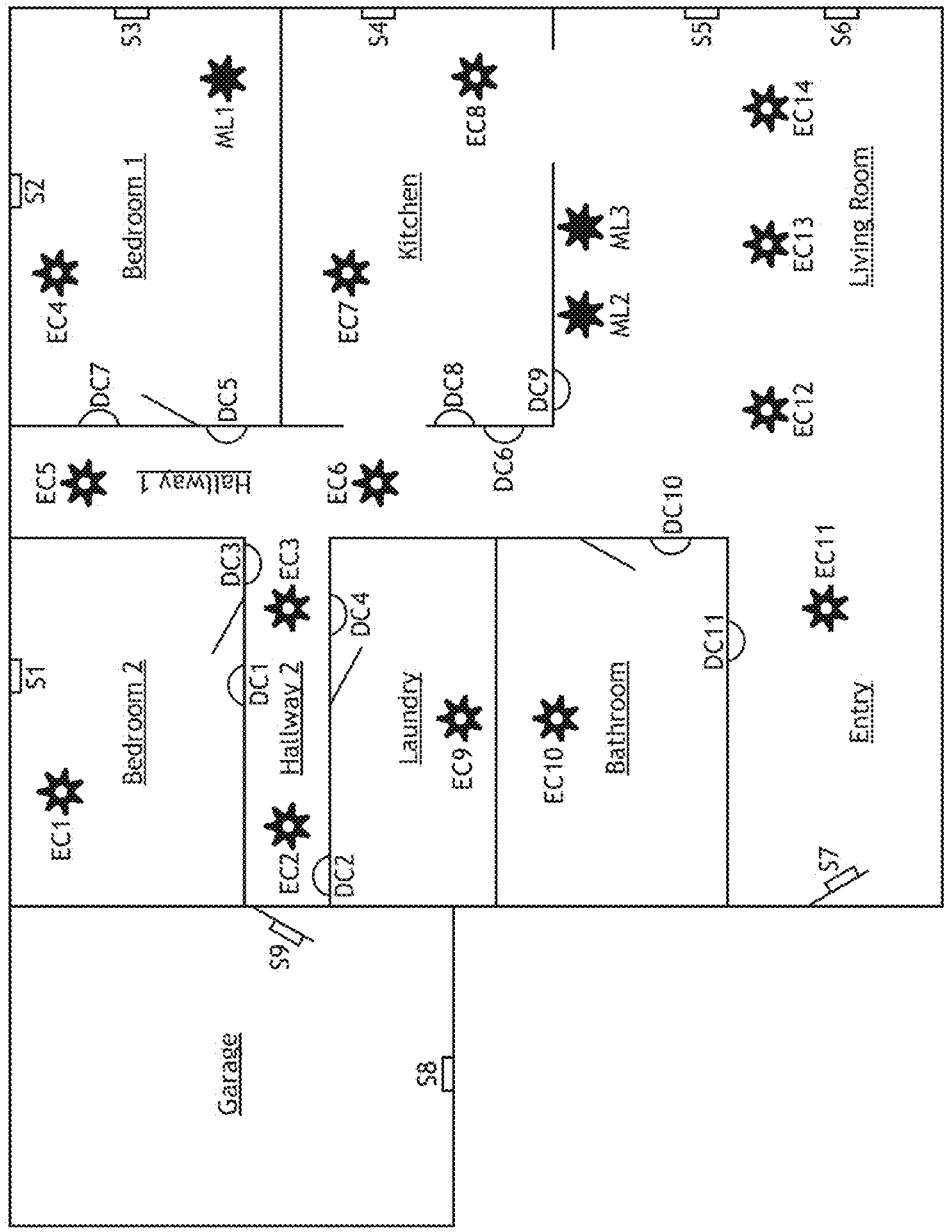
FIG. 8A is an illustration of a configurable network in a household, in accordance with one or more embodiments of the present disclosure.

FIG. 8A is an illustration of a configurable network 800 in a household, in accordance with one or more embodiments of the present disclosure. It is noted herein that the network 800 described herein is provided solely for illustrative purposes and should not be interpreted as limiting the present disclosure. For example, a configurable network may be employed in any environment including, but not limited to industrial buildings, commercial buildings, multi-family households, or outdoors.

In some embodiments, the configurable network 800 includes as nodes device control assemblies DC1-DC11, electrically-connected luminaires EC1-EC14 (e.g. luminaires physically paired to one or more device control assemblies), network-connected luminaires ML1-ML3 (e.g. mesh-connected luminaires), and window/door sensors S1-S8. In some embodiments, all nodes of the configurable network 800 are communicatively coupled via data connections. In some embodiments, the pairings between device control assemblies, electrically-connected luminaires, network-connected luminaires, and sensors are summarized in FIG. 8B. Further, the pairing type (e.g. physical or addressable) between connected devices is summarized in FIG. 8C. It is noted herein that device control assemblies 110 may be simultaneously paired with multiple device types (e.g. DC7 and DC9 are paired with electrically-connected luminaires, network-connected luminaires, and sensors), as shown in FIG. 8B. Further, connected devices may be simultaneously paired with multiple device control assemblies, as shown in FIG. 8C. For example, EC2 is physically paired with DC2 and addressably paired with DC3. Similarly EC3 is physically paired with DC3 and addressably paired with DC2. Together, DC2 and DC3 operate, via data pathways of the network 800, as a three-way switch to simultaneously control EC2 and EC3.

As another example, custom switching patterns may be defined through defined pairings of device control assemblies and load devices. For example, DC5 and DC6 are paired to luminaires EC5, EC6, and EC12, and an exemplary state diagram is provided in FIG. 8D. Further, EC12 is additionally paired to DC 9. In this regard, EC5 and EC6 are controlled by DC5 and DC6 in a traditional three-way switch configuration. Accordingly, actuating either DC5 or DC6 will actuate both EC5 and EC6. However, the state of EC12 is dependent on the current state and on the actuating device (e.g. DC5, DC6, or DC12), as shown in FIG. 8D.

It is noted herein that any number of device pairings between device control assemblies DC1-DC11, electrically-connected luminaires EC1-EC14, and network-connected luminaires ML1-ML3 may be established via the configurable network 800. Accordingly, the descriptions of pairings above are intended solely for illustrative purposes and should not be interpreted as limiting.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A network of backplates, comprising:
   two or more backplates configured to mount to one or more electrical junction boxes, the two or more backplates configured to couple with any of two or more device control assemblies, wherein the two or more device control assemblies are configured to be in data communication with each other, each backplate of the two or more backplates comprising:
   a backplate junction box electrical connector configured to connect to electrical wiring within an electrical junction box of the one or more electrical junction boxes;
   a housing providing a cavity to receive any device control assembly of the two or more device control assemblies;
   a set of backplate electrical contacts configured to connect to the backplate junction box electrical connector;
   a cover, the cover configured to shield the set of backplate electrical contacts from the cavity when translated to a closed position by a user, the cover further configured to expose the set of backplate electrical contacts to the cavity when translated to an open position by the user; and
   a lock configured to maintain the cover in the closed position unless a device control assembly of the two or more device control assemblies is inserted into the cavity, wherein inserting the device control assembly into the cavity by the user engages the lock to allow the cover to be translated to the open position by the user to connect the set of backplate electrical contacts to a set of device control assembly electrical contacts on the device control assembly.

2. The network of backplates of claim 1, wherein the two or more device control assemblies are configured to be in data communication with each other via a wired data pathway.

3. The network of backplates of claim 2, wherein the wired data pathway includes a wired electrical connection between a backplate of the two or more backplates and the electrical wiring within an electrical junction box of the one or more electrical junction boxes.

4. The network of backplates of claim 1, wherein the network further comprises:
at least one of a sensor, a luminaire, a mobile device, or an electrical appliance.

5. The network of backplates of claim 1, wherein the lock is configured to restrict motion of the cover when the cover is in the closed position, wherein inserting the device control assembly into the cavity by the user translates the lock to provide clearance for the user to translate the cover to to the open position.

6. The network of backplates of claim 5, wherein the lock includes a graded portion, wherein contact between the device control assembly and the graded portion of the lock translates the lock to provide clearance for the user to translate the cover to the open position.

7. The network of backplates of claim 1, wherein the set of backplate electrical contacts comprises:
a set of spring contacts.

8. The network of backplates of claim 7, wherein the set of spring contacts comprises:
a set of spring finger contacts.

9. The network of backplates of claim 7, wherein the set of device control assembly electrical contacts comprises:
a set of electrical contact pads.

10. The network of backplates of claim 1, wherein the backplate is configured to couple or decouple with the device control assembly when the backplate junction box electrical connector is connected to live power via the electrical wiring within the electrical junction box.

11. The network of backplates of claim 1, wherein the two or more device control assemblies include at least one of a switch, a dimmer, an outlet, a sensor, or a control panel.

12. A network of device control assemblies, comprising:
two or more device control assemblies configured to couple with any of two or more backplates, wherein the two or more device control assemblies are configured to be in data communication with each other, the two or more backplates configured to mount to one or more electrical junction boxes and further configured to connect to electrical wiring within the one or more electrical junction boxes, each backplate of the two or more backplates comprising:
a housing providing a cavity to receive a device control assembly of the two or more device control assemblies, the device control assembly including a set of device control assembly electrical contacts;
a set of backplate electrical contacts configured to connect to the electrical wiring within an electrical junction box of the one or more electrical junction boxes;
a cover, the cover configured to shield the set of backplate electrical contacts from the cavity when translated to a closed position by a user, the cover further configured to expose the set of backplate electrical contacts to the cavity when translated to an open position by the user; and
a lock configured to maintain the cover in the closed position unless a device control assembly of the two or more device control assemblies are inserted into the cavity, wherein inserting the device control assembly into the cavity by the user engages the lock to allow the cover to be translated to the open position by the user to connect the set of backplate electrical contacts to a set of device control assembly electrical contacts on the device control assembly.

13. The network of device control assemblies of claim 12, wherein the two or more device control assemblies include at least one of a switch, a dimmer, an outlet, a sensor, or a control panel.

14. The network of device control assemblies of claim 12, wherein a first device control assembly of the two or more device control assemblies is configured to regulate an electrical load.

15. The network of device control assemblies of claim 14, wherein the first device control assembly is configured to regulate the electrical load through regulation of at least one of a current or a voltage to the electrical load.

16. The network of device control assemblies of claim 14, wherein the first device control assembly is configured to be in data communication with the electrical load, wherein the first device control assembly regulates the electrical load based on data communication with the electrical load.

17. The network of device control assemblies of claim 14, wherein the first device control assembly is configured to regulate the electrical load based on data communication from a second device control assembly of the two or more device control assemblies in response to user input on the second device control assembly.

18. The network of device control assemblies of claim 17, wherein the second device control assembly is assigned to operate the electrical load via the first device control assembly based on a pairing between the second device control assembly and the electrical load.

19. The network of device control assemblies of claim 18, wherein the pairing is determined by the second device control assembly.

20. The network of device control assemblies of claim 18, wherein the pairing is determined by a controller.

21. The network of device control assemblies of claim 20, wherein the controller includes a centralized controller.

22. The network of device control assemblies of claim 21, wherein the centralized controller comprises:
at least one of a hub, a server, or a desktop computer.

23. The network of device control assemblies of claim 20, wherein the controller includes a distributed controller.

24. The network of device control assemblies of claim 23, wherein the distributed controller comprises:
at least two of the two or more device control assemblies.

25. The network of device control assemblies of claim 17, wherein the second device control assembly is configured to operate regulate an additional load via an additional device control assembly of the two or more device control assemblies, wherein the additional device control assembly is configured to regulate the additional load.

26. The network of device control assemblies of claim 25, wherein the additional device control assembly is the first device control assembly.

27. The network of device control assemblies of claim 12, wherein the two or more device control assemblies are configured to be in data communication with each other via a network topology comprising:
at least one of a mesh topology, a star topology, a ring topology, a line topology, a tree topology, or a bus topology.

28. The network of device control assemblies of claim 27, wherein the network topology includes a flood mesh topology.

29. The network of device control assemblies of claim 12, wherein the two or more device control assemblies are configured to be in data communication with each other via at least one of a single-hop pathway or a multi-hop pathway.

30. The network of device control assemblies of claim 12, wherein the two or more device control assemblies are configured to be in data communication with each other via a wireless data pathway.

31. The network of device control assemblies of claim 30, wherein the wireless data pathway includes a radio frequency connection.

32. The network of device control assemblies of claim 30, wherein the wireless data pathway is based on a WiFi protocol, a Bluetooth Low Energy protocol, a ZigBee protocol, or a Z-wave protocol.

33. The network of device control assemblies of claim 12, wherein the two or more device control assemblies are configured to be in data communication with each other via a wired data pathway.

34. The network of device control assemblies of claim 33, wherein the wired data pathway comprises:
- one or more electrical wires associated with the electrical wiring within the one or more electrical junction boxes.

35. The network of device control assemblies of claim 33, wherein the wired data pathway is based on a universal powerline bus protocol, an X10 protocol, a LonTalk protocol, a Homeplug AV protocol, or a Powerline AV protocol.

36. The network of device control assemblies of claim 12, wherein the network further includes:
- at least one of a sensor, a luminaire, a mobile device, or an electrical appliance.

37. A network of modular control units, comprising:
- two or more device control assemblies configured to be in data communication with each other; and
- two or more backplates configured to couple with any of the two or more device control assemblies, each of the two or more backplates configured to mount to one or more electrical junction boxes and further configured to connect to electrical wiring within the one or more electrical junction boxes, each backplate of the two or more backplates comprising:
  - a housing providing a cavity to receive any device control assembly of the two or more device control assemblies;
  - a set of backplate electrical contacts configured to connect to the electrical wiring of an electrical junction box of the one or more electrical junction boxes;
  - a cover, the cover configured to shield the set of backplate electrical contacts from the cavity when translated to a closed position by a user, the cover further configured to expose the set of backplate electrical contacts to the cavity when translated to an open position by the user; and
  - a lock configured to maintain the cover in the closed position unless a device control assembly of the two or more device control assemblies is inserted into the cavity, wherein inserting the device control assembly into the cavity by the user engages the lock to allow the cover to be translated to the open position by the user to connect the set of backplate electrical contacts to a set of device control assembly electrical contacts on the device control assembly.

38. The network of modular control units of claim 37, wherein the two or more device control assemblies includes at least one of a switch, a dimmer, an outlet, a sensor, or a control panel.

39. The network of modular control units of claim 37, wherein a first device control assembly of the two or more device control assemblies is configured to regulate an electrical load.

40. The network of modular control units of claim 39, wherein the first device control assembly is configured to regulate the electrical load through regulation of at least one of a current or a voltage to the electrical load.

41. The network of modular control units of claim 39, wherein the first device control assembly is configured to be in data communication with the electrical load, wherein the first device control assembly regulates the electrical load based on data communication with the electrical load.

42. The network of modular control units of claim 39, wherein the first device control assembly is configured to regulate the electrical load based on data communication from a second device control assembly of the two or more device control assemblies in response to user input on the second device control assembly.

43. The network of modular control units of claim 42, wherein the second device control assembly is assigned to operate the electrical load via the first device control assembly based on a pairing between the second device control assembly and the electrical load.

44. The network of modular control units of claim 39, wherein the second device control assembly is configured to operate an additional load via an additional device control assembly of the two or more device control assemblies, wherein the additional device control assembly is configured to regulate the additional load.

45. The network of modular control units of claim 44, wherein the additional device control assembly is the first device control assembly.

46. The network of modular control units of claim 37, wherein the network further includes:
- at least one of a sensor, a luminaire, a mobile device, or an electrical appliance.

* * * * *